(12) United States Patent
Ando et al.

(10) Patent No.: US 10,361,368 B2
(45) Date of Patent: Jul. 23, 2019

(54) CONFINED LATERAL SWITCHING CELL FOR HIGH DENSITY SCALING

(71) Applicant: INTERNATIONAL BUSINESS MACHINES CORPORATION, Armonk, NY (US)

(72) Inventors: Takashi Ando, Tuckahoe, NY (US); Robert Bruce, White Plains, NY (US); John Rozen, Hastings on Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/800,521

(22) Filed: Nov. 1, 2017

(65) Prior Publication Data

US 2019/0131525 A1    May 2, 2019

(51) Int. Cl.
*H01L 47/00* (2006.01)
*H01L 45/00* (2006.01)
(Continued)

(52) U.S. Cl.
CPC ........ *H01L 45/1683* (2013.01); *H01L 45/085* (2013.01); *H01L 45/124* (2013.01);
(Continued)

(58) Field of Classification Search
CPC . H01L 45/1683; H01L 45/085; H01L 45/124; H01L 45/1266; H01L 45/146;
(Continued)

(56) References Cited

U.S. PATENT DOCUMENTS 8,034,655 B2   10/2011  Smythe et al.
8,525,247 B2    9/2013  Park et al.
(Continued)

OTHER PUBLICATIONS

Baek, I.G. et al., "Realization of vertical resistive memory (VRRAM) using cost effective 3D process" International Electron Devices Meeting, IEDM (Dec. 2011) pp. 1-4, vol. 31, No. 8.
(Continued)

*Primary Examiner* — Victor A Mandala
*Assistant Examiner* — Colleen E Snow
(74) *Attorney, Agent, or Firm* — Tutunjian & Bitetto, P.C.; Vazken Alexanian

(57) ABSTRACT

A memory device including a via opening through a dielectric layer and an inert electrode having a conformal thickness present on sidewalls but recessed from the top of the via and a base surface of the via opening through the dielectric layer. A metal oxide layer provides a filament forming layer for the memory device and is present in direct contact with the inert electrode. The metal oxide layer also has a conformal thickness and has vertically orientated portions on the portion of the inert electrode overlying the sidewalls of the via opening, and horizontally orientated portions on the portion of the inert electrode overlying the base of the via opening. A reactive electrode is in direct contact with the metal oxide layer. Switching of the memory device includes a laterally orientated direction across the vertically orientated portion of the metal oxide layer in regions not modified by patterning of the conformal metal-oxide layer.

20 Claims, 5 Drawing Sheets

(51) Int. Cl.
*G06N 3/063* (2006.01)
*H01L 27/24* (2006.01)

(52) U.S. Cl.
CPC ........ *H01L 45/1266* (2013.01); *H01L 45/146* (2013.01); *H01L 45/147* (2013.01); *H01L 45/1616* (2013.01); *G06N 3/0635* (2013.01); *H01L 27/2481* (2013.01)

(58) Field of Classification Search
CPC ............... H01L 45/147; H01L 45/1616; H01L 27/2481; G06N 3/0635
See application file for complete search history.

(56) References Cited

U.S. PATENT DOCUMENTS

| | | | |
|---|---|---|---|
| 8,872,256 | B2 | 10/2014 | Lee et al. |
| 8,921,818 | B2 | 12/2014 | Tu et al. |
| 9,305,977 | B1 | 4/2016 | Hsu |
| 9,318,704 | B2 | 4/2016 | Seong et al. |
| 2013/0077379 | A1* | 3/2013 | Matsudaira ......... H01L 27/1052 365/148 |
| 2017/0236869 | A1* | 8/2017 | Tran .................... H01L 27/2436 257/4 |

OTHER PUBLICATIONS

Chien, W.C. et al., "Multi-layer sidewall WOx resistive memory suitable for 3D ReRAM" Symposium on VLSI Technology (Jun. 2012) pp. 153-154.

Hayakawa, Y. et al., "Highly reliable TaOx ReRAM with centralized filament for 28-nm embedded application" Symposium on VLSI Technology (Jun. 2015) pp. T14-T15.

Wong, H.S. et al., "Metal—oxide RRAM" Proceedings of the IEEE (May 2012) pp. 1951-1970, vol. 100, No. 6.

* cited by examiner

US 10,361,368 B2

CONFINED LATERAL SWITCHING CELL FOR HIGH DENSITY SCALING

BACKGROUND

Technical Field

The present invention relates generally to memory devices and, in particular, to a resistive switching memory stack for a three-dimensional structure.

Description of the Related Art

Resistive random access memory (a.k.a. RRAM or ReRAM) is considered as a promising technology for electronic synapse devices or memristor for neuromorphic computing as well as high-density and high-speed non-volatile memory application.

In neuromorphic computing applications, a resistive memory device can be used as a connection (synapse) between a pre-neuron and post-neuron, representing the connection weight in the form of device resistance.

Multiple pre-neurons and post-neurons can be connected through a crossbar array of RRAMs, which naturally expresses a fully-connected neural network.

The density of ReRAM can be increased by vertically stacking ReRAM stacks as practiced in Flash NAND technology, however, ReRAM stacks are typically deposited by Physical Vapor Deposition (PVD) to control the oxygen vacancy concentration in the metal oxide layer and this prevents application to three-dimensional (3D) structures.

SUMMARY

According to an aspect of the present invention, a resistive switching memory stack is provided. The resistive switching memory stack may provide a resistive random access memory (ReRAM) cell for a vertical resistive memory device having a cross-bar architecture, in which the resistive random access memory (ReRAM) cell allows for lateral switching of the memory states. In one embodiment, the memory device includes a via opening through a dielectric layer and an inert electrode having a conformal thickness present on sidewalls and a base surface of the via opening through the dielectric layer. A metal oxide layer provides a filament forming layer for the memory device is present in direct contact with the inert electrode. The metal oxide layer also has a conformal thickness. The metal oxide layer has vertically orientated portions on the portion of the inert electrode overlying the sidewalls of the via opening, and horizontally orientated portions on the portion of the inert electrode overlying the base of the via opening. A reactive electrode is in direct contact with the metal oxide layer. The reactive electrode also has a conformal thickness and is present on the vertically orientated and horizontally orientated portions of the metal oxide layer. Switching of the memory device includes a laterally orientated direction across the vertically orientated portion of the metal oxide layer.

In some embodiments, because the uppermost region of the memory device in which the electrical switching occurs is present at the uppermost surface of the inert electrode, and the upper most surface of the inert electrode is recessed within the via containing the memory device, the portion of the memory device at which switching occurs is separated from the portions of the memory device at which any damage can occur from planarization or etch that is performed for providing a memory device having an upper surface coplanar with the upper surface of the dielectric through which the via containing the memory device is present.

In another embodiment, the memory device includes a via opening through a dielectric layer to a bottom contact line, and an inert electrode present on sidewalls of the via opening. A metal oxide layer is present in direct contact with the inert electrode and the bottom contact line. The metal oxide layer has a conformal thickness and has vertically orientated portions on the inert electrode, and horizontally orientated portions on a portion of the bottom contact line positioned at a base of the via opening. A reactive electrode is in direct contact with the metal oxide layer. The reactive electrode has a conformal thickness and is present on the vertically orientated and horizontally orientated portions of the metal oxide layer. Switching of the memory device includes a laterally orientated direction across the vertically orientated portion of the metal oxide layer in regions not modified by patterning of the conformal metal-oxide layer.

According to another aspect of the present invention, a method is provided for forming a resistive switching memory stack that can provide for lateral switching of the resistive random access memory cell. In one embodiment, the method includes forming an inert electrode having a conformal thickness present on at least a sidewall of a via opening through a dielectric layer by atomic layer deposition. A metal oxide layer provides a filament forming layer for the memory device, and is present in direct contact with the inert electrode. The metal oxide layer is formed using atomic layer deposition and also has a conformal thickness with vertically orientated portions on a portion of the inert electrode overlying the sidewalls of the via opening, and horizontally orientated portions positioned at a base of the via opening. A reactive electrode deposited using atomic layer deposition is in direct contact with the metal oxide layer. The reactive electrode also has a conformal thickness and is present on the vertically orientated and horizontally orientated portions of the metal oxide layer. Switching of the memory device includes a laterally orientated direction across the vertically orientated portion of the metal oxide layer in regions not modified by patterning of the conformal metal-oxide layer.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
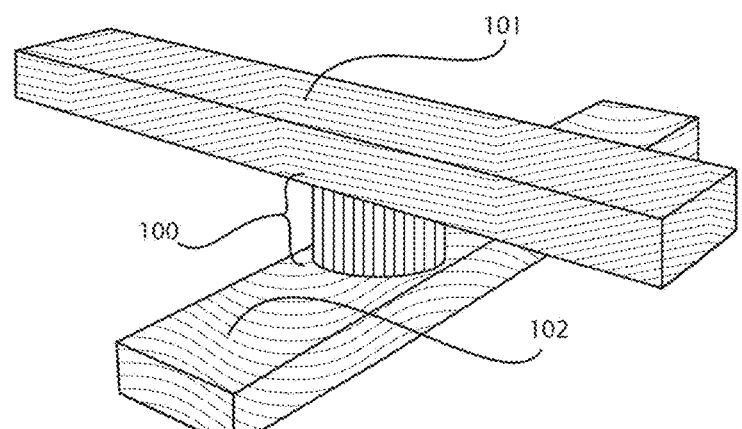
FIG. 1 is a perspective view of one embodiment of a vertical resistive random access memory (VRRAM) device having a cross-bar architecture.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The present disclosure is directed to a resistive switching memory stack for a three-dimensional structures. More particularly, the methods and structures described herein provide for a confined lateral switching cell for high density scaling of resistive memory stacks. As used herein, the term "memory device" means a structure in which the electrical state can be altered and then retained in the altered state, in this way a bit of information can be stored.

In some vertical resistive memory (VRRAM) devices, a material stack of an atomic layer deposition (ALD) deposited tantalum oxide layer/barrier layer, and chemical vapor deposition (CVD) deposited titanium nitride (TiN) layer has been proposed for resistive random access memory (ReRAM) stacks around vertical electrodes. It has been determined that in these structures, the resistance of the vertical electrodes can become high due to the limited area that is available for metal deposition, as the via diameter is scaled to increasingly smaller dimensions. In a vertical resistive random access memory (VVRAM) structure, the unit resistive random access memory (ReRAM) cell area is defined by (1) thickness of the horizontal electrode (T) and (2) diameter of the vertical electrode (R) (i.e., the unit cell area—Pi×R×T). It has been determined that these parameters are set to meet the resistivity requirements, and therefore the cell area cannot be tuned independently.

In some embodiments, the aforementioned disadvantages are overcome by the structures and methods provided herein that include a lateral switching confined cell structure in a cross-point architecture using conformal metal-insulator-metal stack that is enabled by atomic layer deposition (ALD). The term "conformal" denotes a layer having a thickness that does not deviate from greater than or less than 30% of an average value for the thickness of the layer. Atomic Layer Deposition (ALD) is a thin film deposition method in which a film is grown on a substrate by exposing its surface to alternate gaseous species (typically referred to as precursors). In contrast to chemical vapor deposition, the precursors in ALD are never present simultaneously in the reactor, but instead are inserted as a series of sequential, non-overlapping pulses. In each pulse, the precursor molecules react with the surface in a self-limiting way, so that the reaction terminates once all the reactive sites on the surface are consumed. Consequently, the maximum amount of material deposited on the surface after a single exposure to all of the precursors (a.k.a. an ALD cycle) is determined by the nature of the precursor-surface interaction. By varying the number of ALD cycles, it is possible to grow materials uniformly and with high precision on arbitrarily complex and large substrates such as three-dimensional structures.

In some embodiments, a conformal inert metal, e.g., titanium nitride (TiN), is used for the side and bottom electrode of the vertical resistive random access memory (VVRAM) structure. In some embodiments, conformal metal oxide films, e.g., hafnium oxide (HfO$_x$) and/or tantalum oxide (TaO$_x$), are used as a filament forming layer. In some embodiments, conformal reactive electrodes, e.g., titanium (Ti) rich titanium nitride (TiN) and/or titanium aluminum carbide ((Ti)AlC) containing stacks, and/or a metal fill, e.g., titanium nitride (TiN), tungsten (W), aluminum (Al), copper (Cu) and combinations thereof, are formed in the remaining vertical gap. These structures can be contacted by the top cross-bar line of a cross bar architecture. In some embodiments, the structures that are provided herein enables area modulation of the cell in the vertical direction at a given cross-bar pitch. The cell footprint and metal oxide active are may be decoupled by the methods and structures provided herein. In some embodiments, the methods and structures of the present disclosure provide vertical scaling that allows for the active oxide area to be higher than the line width. Additionally, the oxide thickness can be thinned to reduce the operating voltage. In some embodiments, the active oxide area by vertical scaling can be tuned to ensure deterministic filament formation at a small pitch due to the large metal-oxide area, reducing the potential for cell-to-cell switching property variation. The methods provided herein can provide that there is no etch damage to the metal oxide related to patterning in the horizontal direction between the inert and active electrode using a confined cell scheme. Therefore, there is no risk for uncontrolled switching at processing-induced defect sites, which occurs at the vertical boundaries of cells deposited by physical vapor deposition (PVD) and patterned by reactive ion etching (RIE).

In some embodiments, the methods and structures provided herein can produce a resistive random access memory (ReRAM) cell, in which the unit cell area can be tuned independently from the electrode dimensions. This allows for the unit cell area to be tuned independently from the electrode dimensions can enable low metal line resistances and optimization of resistive random access memory (ReRAM) switching characteristics simultaneously. For example, the methods and structures provided herein can maximize the metal oxide area for minimum set voltage; and can minimize edge effects. Further, the methods and structures provided herein can increase current density in the electrode/selector independent of the metal oxide area. Additionally, the methods and structures provided herein can substantially eliminate metal oxide etch damage near the active region of the memory device. The methods and structures of the present disclosure are now described with more detail with reference to FIGS. 1-9.

FIG. 1 is a perspective view of one embodiment of a vertical resistive random access memory (VRRAM) device having a cross-bar architecture. The cross-bar architecture refers to the positioning of a memory cell, such as a resistive random access memory (ReRAM) cell 100, between an upper contact line 101 and a lower contact line 102, and refers to the directions of travel for the upper and lower contact lines 101, 102. Resistive random-access memory (RRAM or ReRAM) is a type of non-volatile (NV) random-access (RAM) memory that works by changing the resistance across a dielectric solid-state material. In some instances, the RRAM or ReRAM may be referred to as a memresistor.

The upper contact line 101 and the lower contact line 102 may extend along parrallel planes but may have directions that are perpendicular to one another, as depicted in FIG. 1. The single vertical resistive random access memory (VRRAM) device having the cross-bar architecture that is depicted in FIG. 1 may be integrated into an array of like devices. In the embodiment that is depicted in FIG. 1, the upper contact line 101 is in electrical contact with a reactive electrode 20 of the resistive random access memory (ReRAM) cell 100. In one embodiment that is depicted in FIG. 1, the lower contact line 102 is in electrical contact with an inert electrode 10 of the resistive random access memory (ReRAM) cell 100. Each of the upper contact line 101 and the lower contact line 102 may be composed of an electrically conductive material, such as a metal. Some examples of metals that are suitable for the upper contact line 101 and the lower contact line 102 may include aluminum (Al), copper (Cu), gold (Au), platinum (Pt), silver (Ag), tantalum (Ta), titanium (Ti), tungsten (W) and combinations and alloys thereof. In some examples, a nitride, e.g., titanium nitride (TiN), tantalum nitride (TaN), tungsten nitride and/or (WN), of one of the aforementioned metal examples can provide the composition for at least one of the upper contact line 101 and the lower contact line 102.

It is noted that the upper contact line 101 may also be referred to as top cross-bar line, and the lower contact line 102 may also be referred to as the bottom cross-top line.

The vertical resistive random access memory (VRRAM) device having a cross-bar architecture that is depicted in FIG. 1 may include a via containing the resistive random access memory (ReRAM) cell 100 that extends through an interlevel dielectric 5 (not depicted in FIG. 1). The interlevel dielectric 5 has been omitted from FIG. 1 to provide an unobstructed view of the single vertical resistive random access memory (VRRAM) device having the cross-bar architecture, but is identified by reference number 5 in FIGS. 1-9. The interlevel dielectric 5 may be composed of any dielectric material. In some examples, the interlevel dielectric layer may have a composition that is selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). Additional choices for the interlevel dielectric layer include any of the aforementioned materials in porous form, or in a form that changes during processing to or from being porous and/or permeable to being non-porous and/or non-permeable. Some embodiments of the resistive random access memory (ReRAM) cell 100 are now described with reference to FIGS. 2-4.

Figure 2:
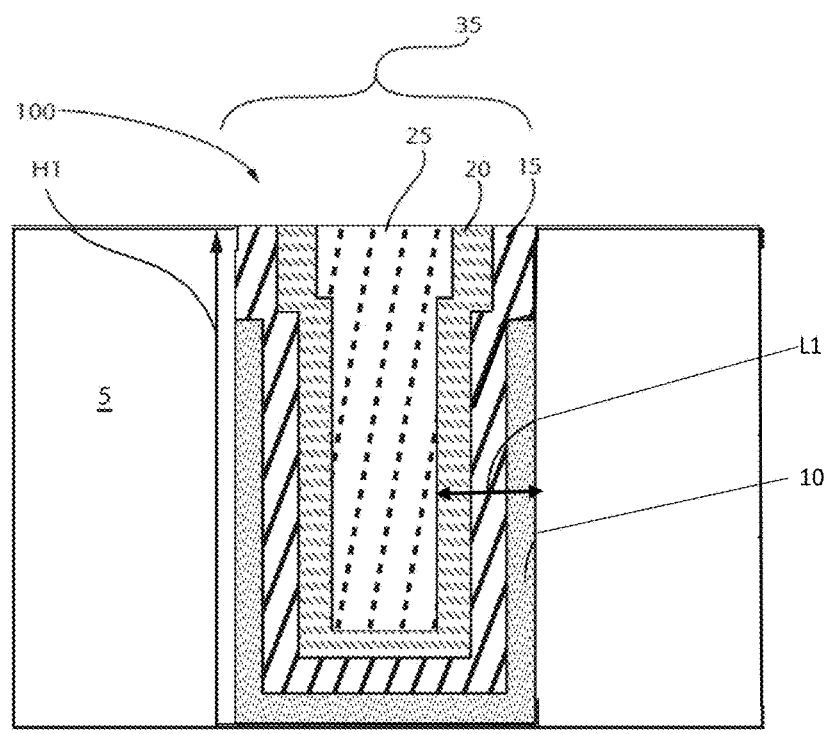
FIG. 2 is a side cross-sectional view of a resistive random access memory (ReRAM) cell that may be integrated into the vertical resistive random access memory (VRRAM) device having the cross-bar architecture that is depicted in FIG. 1, in which the ReRAM cell is switched in a lateral direction across a material stack of conformal layers having a U-shaped geometry including an inert electrode, a metal oxide layer, a reactive electrode, and a metal fill, in accordance with one embodiment of the present disclosure.
Figure 3:
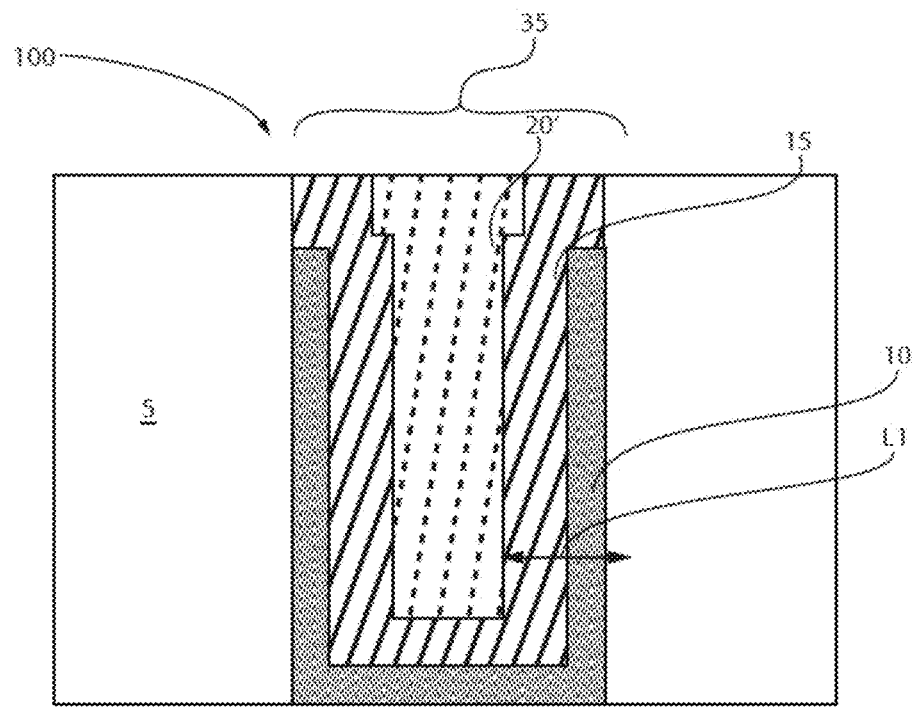
FIG. 3 is a side cross-sectional view of a resistive random access memory (ReRAM) cell that may be integrated into the vertical resistive random access memory (VRRAM) device having the cross-bar architecture that is depicted in FIG. 1, in which the ReRAM cell is switched in a lateral direction across an material stack of conformal layers having a U-shaped geometry including an inert electrode and a metal oxide layer, wherein the ReRAM cell further includes a fill material that provides the reactive electrode of the cell, in accordance with one embodiment of the present disclosure.
Figure 4:
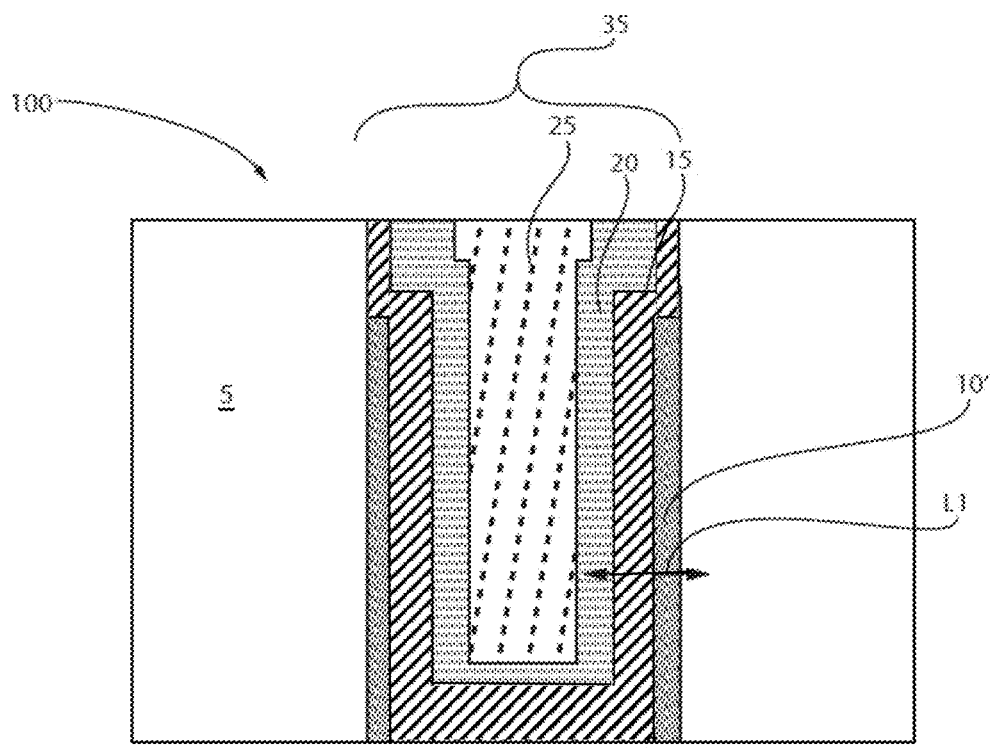
FIG. 4 is a side cross-sectional view of a resistive random access memory (ReRAM) cell that may be integrated into the vertical resistive random access memory (VRRAM) device having the cross-bar architecture that is depicted in FIG. 1, in which the ReRAM cell is switched in a lateral direction across an material stack of conformal layers having a U-shaped geometry including an inert electrode, a metal oxide layer, a reactive electrode, and a metal fill, in which the inert electrode is entirely vertically orientated, in accordance with one embodiment of the present disclosure.

FIGS. 2-4 depict some embodiments of a memory device, e.g., vertical resistive random access memory (VRRAM) device having a cross-bar architecture, which includes a resistive random access memory (ReRAM) cell 100. The memory device may include a via opening 35 through a dielectric layer, i.e., interlevel dielectric layer 5. The vertical resistive random access memory (ReRAM) cell 100 can be present within the via opening 35. When viewed from a top-down perspective the via opening 35 may have a circular, oblong, or substantially circular cross section. It is not necessary that the via opening have a circular like cross-section. In other embodiments, the via opening 35 may have a multi-sided cross-section, such as a square cross-section. Although not depicted in FIGS. 2-4, the upper contact line 101 and the lower contact line 102 may be present on opposing ends of the resistive random access memory (ReRAM) cell 100.

The resistive random access memory (ReRAM) cell 100 may include an inert electrode 10, a metal oxide layer 15, and a reactive electrode 20. The metal oxide layer 15 provides a filament forming layer for the memory device and is present in direct contact with the inert electrode 10 and the reactive electrode 20. The metal oxide layer 15 is physically separated from the upper contact line 101 by the reactive electrode 20. The metal oxide layer 15 can be physically separated from the lower contact line 102 by the inert electrode 10. As noted above, the reactive electrode 20 is in direct electrical contact with the upper contact line 101, and the inert electrode 10 is in direct electrical contact with the lower contact line 102.

It is noted that the metal oxide layer 15 includes a vertically orientated portion that is overlying the sidewall of the via opening 35. The term "vertically orientated" denotes a portion that extends along a majority of the sidewall of the via opening 35 that determines the via's height H1. More specifically, in one embodiment, the vertically orientated portion of the metal oxide layer 15 is in direct contact with a vertically orientated portion of the inert electrode 10. The reactive electrode 20 is in direct contact with an opposite side of the vertically orientated portion of metal oxide layer 15 that the inert electrode 10 is in direct contact with. The metal oxide layer 15 functions as a filament forming layer of the resistive random access memory (ReRAM) cell 100. This provides that a portion of the electrical characteristics of the resistive random access memory (ReRAM) cell 100 occurs across the vertically orientated portion of the metal oxide layer 15 in a lateral direction L1, as depicted in FIGS. 2-4. For example, switching of the memory device, e.g., via different resistive states, can include electrical characteristics measures from the laterally orientated interaction across the vertically orientated portion of the metal oxide layer 15, e.g., measured from the inert electrode 10 to the reactive electrode 20. Therefore the uppermost potential filament location in the metal-oxide 15 is established by the recess of the inert electrode 10 relative to the top of the via. This is away from any patterned edge of the metal-oxide 15 and mitigates etch-induced filament formation in the metal-oxide.

The uppermost region of the memory device in which the electrical switching occurs is present at the uppermost surface of the inert electrode, and the upper most surface of the inert electrode is recessed within the via containing the memory device. This provides that the portion of the memory device at which switching occurs is separated from the portions of the memory device at which any damage can occur from planarization or etch that is performed for providing a memory device having an upper surface coplanar with the upper surface of the dielectric through which the via containing the memory device is present.

In some embodiments, the resistive random access memory (ReRAM) cell 100 including the aforementioned vertically orientated portions of at least one of the inert electrode 10, the metal oxide layer 15 and the reactive electrode 20 enables area modulation of the resistive random access memory (ReRAM) cell 100 in the vertical direction at a given cross-bar pitch. The resistive random access memory (ReRAM) cell 100 footprint and metal oxide active portion area may be decoupled by the methods and structures provided herein. In some embodiments the oxide thickness, i.e., thickness of the metal oxide layer 15, can be thinned to reduce the operating voltage. In some embodiments, the active oxide area by vertical scaling, i.e., scaling of the vertically orientated portions of the metal oxide layer 15, can be tuned to ensure deterministic filament formation at a small pitch.

Referring to FIGS. 2 and 3, the resistive random access memory (ReRAM) cell 100 may include an inert electrode 10 including a conformal thickness present on sidewalls and a base surface of the via opening 35 through the dielectric layer 5. The portion of the inert electrode 10 at the base surface of the via opening 35 may be referred to as horizontally orientated, and may be in direct contact with the lower contact line 102. In some embodiments, the inert electrode 10 is a metal containing composition selected from the group consisting of ruthenium (Ru), titanium nitride (TiN), tungsten (W), tantalum nitride (TaN) and combinations thereof. The thickness of the inert electrode 10 has a conformal thickness ranging from 1 nm to 50 nm. In one example, the inert electrode 10 is composed of titanium nitride (TiN) having a thickness ranging from 10 nm to 50 nm. In another example, the inert electrode 10 is composed of titanium nitride (TiN) having a thickness ranging from 5 nm to 10 nm.

The conformal thickness of the inert electrode 10 is continuous from the vertically orientated portions to the horizontally orientated portions, in which when viewed from a side cross-section as illustrated in FIGS. 2 and 3, the inert electrode 10 has a U-shaped geometry.

Still referring to FIGS. 2 and 3, in some embodiments, the metal oxide layer 15 is present in direct contact with the inert electrode 10, as well as being in direct contact with the reactive electrode 20. Similar to the inert electrode 10, the metal oxide layer 15 is also a material layer having a conformal thickness with vertically orientated and horizontally orientated portions. The vertically orientated portions of the metal oxide layer 15 are present on, i.e., in direct contact with, the portion of the inert electrode 10 that is overlying the sidewalls of the via opening 35. The horizontally orientated portions of the metal oxide layer 15 are present on, i.e., in direct contact with horizontal portions of the inert electrode overlying the base of the via opening. In some embodiments, the metal oxide layer 15 is composed of a composition selected from the group consisting of hafnium oxide ($HfO_2$), tantalum oxide ($Ta_2O_5$), titanium oxide ($TiO_2$), tungsten oxide ($WO_3$), zirconium oxide ($ZrO_2$), aluminum oxide ($Al_2O_3$), strontium titanium oxide ($SrTiO_3$) and combinations thereof. The metal oxide layer 15 may have a thickness ranging from 1 nm to 15 nm. In one example, the metal oxide layer 15 may be composed of hafnium oxide ($HfO_2$), and may have a thickness ranging from 3 nm to 10 nm. In another example, the metal oxide layer 15 may be composed of tantalum oxide ($Ta_2O_5$), and may have a thickness ranging from 3 nm to 10 nm.

The conformal thickness of the metal oxide layer 15 is continuous from the vertically orientated portions to the horizontally orientated portions, in which when viewed from a side cross-section as illustrated in FIGS. 2 and 3, the metal oxide layer 15 has a U-shaped geometry.

Referring to FIG. 2, in some embodiments, the reactive electrode 20 may have a conformal thickness having vertically orientated portions on a portion of the metal oxide layer 15 overlying the sidewalls of the via opening 35, and horizontally orientated portions on portions of the metal oxide layer 15 overlying the base of the via opening 35. The conformal thickness of the reactive electrode 20 is continuous from the vertically orientated portions to the horizontally orientated portions, in which when viewed from a side cross-section as illustrated in FIG. 2, the reactive electrode 20 has a U-shaped geometry. The reactive electrode 20 is in direct contact with a top contact line 101 of the cross-bar architecture. The reactive electrode 20 is composed of a metal containing composition selected from the group consisting of titanium nitride (TiN), tantalum nitride (TaN), (M)AlC, where M is a transition metal selected from the group consisting of Ti, Ta, and Nb, and combinations thereof.

The reactive electrode 20 may be a single material layer, or the reactive electrode 20 may be a multi-layered stack. In some embodiments, the reactive electrode 20 may have a thickness ranging from 1 nm to 70 nm. In some embodiments, the reactive electrode 20 is composed of a material stack including a titanium (Ti) rich titanium nitride (TiN) layer, and a titanium aluminum carbon containing, e.g., (Ti)AlC, containing stack. In one example, the reactive electrode 20 is composed of a titanium nitride (TiN) first layer having a thickness ranging from 0.3 nm to 3 nm that is in direct contact with the metal oxide layer 15; a titanium aluminum carbon (TiAlC) layer having a thickness ranging from 1 nm to 5 nm that is in direct contact with the titanium nitride (TiN) first layer; and a titanium nitride (TiN) second layer having a thickness ranging from 10 nm to 50 nm that is in direct contact with the titanium aluminum carbon (TiAlC) layer.

Still referring to FIG. 2, a metal fill 25 fills remainder of the via opening 35 that is not occupied by the inert electrode 10, metal oxide layer 15 and the reactive electrode 20. The metal fill 25 may be composed of any electrically conductive material and is substantially centrally positioned within the via opening 35. For example, the metal fill 25 may be composed of aluminum (Al), copper (Cu), gold (Au), platinum (Pt), silver (Ag), tantalum (Ta), titanium (Ti), tungsten (W) and combinations and alloys thereof. In some examples, a nitride, e.g., titanium nitride (TiN), tantalum nitride (TaN), tungsten nitride and/or (WN), of one of the aforementioned metal examples can provide the composition for the metal fill 25. It is noted that the metal fill 25 is optional, and in some embodiments may be omitted.

In some embodiments, the uppermost surface of the metal fill 25, the reactive electrode 20, and the metal oxide layer 15 may be coplanar to each other, as well as being coplanar with the upper surface of the interlevel dielectric 5. In some embodiments, the uppermost surface of the metal fill 25, the reactive electrode 20, and the metal oxide layer 15 may be in direct contact with the upper contact line 101 that is depicted in FIG. 1.

FIG. 3 depicts another embodiment of a resistive random access memory (ReRAM) cell 100 that may be integrated into the vertical resistive random access memory (VRRAM) device having the cross-bar architecture that is depicted in FIG. 1. Similar to the embodiment depicted in FIG. 2, the ReRAM cell 100 can be switched in a lateral direction L1 across a material stack of conformal layers having a U-shaped geometry including an inert electrode 10, and a metal oxide layer 15. The inert electrode 10 and the metal oxide layer 15 that are depicted in FIG. 3 have been described above with reference to FIG. 2. The resistive random access memory (ReRAM) cell 100 that is depicted in FIG. 3 differs from the resistive random access memory (ReRAM) cell 100 that is depicted in FIG. 3, because in the embodiment that is depicted in FIG. 2 the reactive electrode 20 is a conformal layer having a U-shaped geometry, and in the embodiment depicted in FIG. 3, the ReRAM cell 100 includes a fill material that provides the reactive electrode 20'. In the ReRAM cell 100 depicted in FIG. 3, metal fill material that fills the remainder of the via opening 35 not occupied by the inert electrode 10 and the metal oxide layer 15 is the material that provides the reactive electrode 20'. In some embodiments, the reactive electrode 20' is composed of a metal containing composition selected from the group consisting of titanium nitride (TiN), tantalum nitride (TaN), (M)AlC, where M is a transition metal selected from the group consisting of Ti, Ta, and Nb, and combinations thereof. In some embodiments, the reactive electrode 20' may be composed of a single composition metal. In other embodiments, the reactive electrode 20' may be composed of a multilayered stack of materials. In one example, the reactive electrode 20' is composed of titanium nitride (TiN). In another example, the reactive electrode 20' is composed of a titanium (Ti) rich titanium nitride (TiN) layer, and a titanium aluminum carbon containing, e.g., (Ti)AlC, containing stack.

In some embodiments, the uppermost surface of the reactive electrode 20' and the metal oxide layer 15 may be coplanar to each other, as well as being coplanar with the upper surface of the interlevel dielectric 5. In some embodiments, the uppermost surface of the reactive electrode 20', and the metal oxide layer 15 may be in direct contact with the upper contact line 101 that is depicted in FIG. 1.

FIG. 4 depicts one embodiment of a resistive random access memory (ReRAM) cell 100 that may be integrated into the vertical resistive random access memory (VRRAM) device having the cross-bar architecture that is depicted in FIG. 1, in which the ReRAM cell is switched in a lateral L1 direction across an material stack of conformal layers having a U-shaped geometry including a metal oxide layer 15 and a reactive electrode 20, in which the inert electrode 10' is entirely vertically orientated. The metal oxide layer 15 and the reactive electrode 20 that are depicted in FIG. 4 have been described above with reference to FIG. 2. In the embodiment that is depicted in FIG. 4, the horizontal portion of the inert electrode 10' has been removed. With the exception of the middle section of the inert electrode 10' being removed, the remainder of the inert electrode 10' being depicted in FIG. 4 is similar to the inert electrode 10 that is depicted in FIG. 2. For example, the inert electrode 10' may be composed of a metal containing composition selected from the group consisting of ruthenium (Ru), titanium nitride (TiN), tungsten (W), tantalum nitride (TaN) and combinations thereof. The thickness of the inert electrode 10' has a conformal thickness ranging from 1 nm to 50 nm. In one example, the inert electrode 10' is composed of titanium nitride (TiN) having a thickness ranging from 10 nm to 50 nm. In another example, the inert electrode 10' is composed of titanium nitride (TiN) having a thickness ranging from 5 nm to 10 nm.

Referring to FIGS. 5-9, according to another aspect of the present invention, a method is provided for forming a resistive switching memory stack that can provide for lateral switching of the resistive random access memory (ReRAM) cell 100. In one embodiment, the method includes forming an inert electrode 10 having a conformal thickness present on at least a sidewall of a via opening 35 through a dielectric layer, i.e., interlevel dielectric layer 5, by atomic layer deposition (ALD). In some embodiments, a metal oxide layer 15 is formed that provides a filament forming layer for the memory device, and is present in direct contact with the inert electrode 10. The metal oxide layer 15 may be formed using atomic layer deposition (ALD). As described above, the metal oxide layer 15 has a conformal thickness with vertically orientated portions on a portion of the inert electrode 10 overlying the sidewalls of the via opening 35, and horizontally orientated portions positioned at a base of the via opening 35. The method can further include forming a reactive electrode 20 is in direct contact with the metal oxide layer 15. The reactive electrode 20 can be deposited using atomic layer deposition (ALD). The reactive electrode 20 can a conformal thickness and is present on the vertically orientated and horizontally orientated portions of the metal oxide layer 15. Switching of the memory device includes a laterally orientated direction across the vertically orientated portion of the metal oxide layer.

Figure 5:
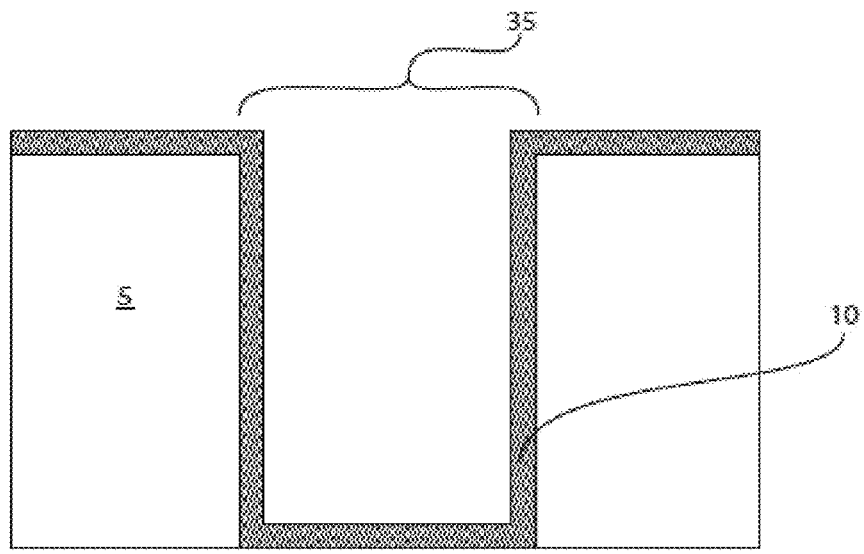
FIG. 5 is a side cross-sectional view of an initial structure for forming a resistive random access memory (ReRAM) cell, in which the material layer for the inert electrode is conformally deposited in a via opening.

FIG. 5 depicts one embodiment of an initial structure for forming a resistive random access memory (ReRAM) cell 100, in which the material layer for the inert electrode 10 is conformally deposited in a via opening 35. In some embodiments, forming the inert electrode 10 having the conformal thickness may begin with the blanket deposition of a material layer for the inert electrode 10 on the sidewall of a via opening 35 provided by dielectric layer, and on the base of the via opening 35 that is provided by the lower contact line 102 by atomic layer deposition (ALD). As depicted in FIG. 5, a portion of the blanket deposited material layer for the inert electrode 10 is also formed on the upper surface of the interlevel dielectric layer 5 outside of the via opening 35. The material layer for the inert electrode can be selected from the group consisting of ruthenium (Ru), titanium nitride (TiN), tungsten (W), tantalum nitride (TaN) and combinations thereof; and the material layer for the inert electrode 10 may have a thickness ranging from 1 nm to 50 nm. For example an inert electrode may be deposited by atomic layer deposition (ALD) using subsequent pulses of $TiCl_4$ and $NH_3$ at temperatures above 350 C.

Figure 6:
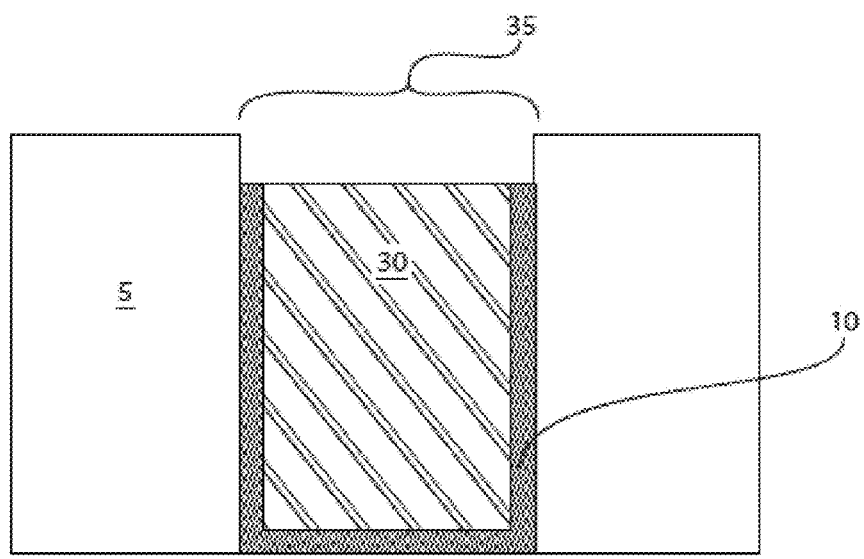
FIG. 6 is a side cross-sectional view depicting filling a remainder of the via opening depicted in FIG. 5 with an organic planarization layer (OPL), recessing the organic planarization layer, and removing the portion of the material layer for the inert electrode that is exposed by recessing the organic planarization layer.

FIG. 6 depicts filling a remainder of the via opening 35 depicted in FIG. 5 with an organic planarization layer (OPL) 30, recessing the organic planarization layer 30, and removing the portion of the material layer for the inert electrode 10 that is exposed by recessing the organic planarization layer 30. The organic planarization layer (OPL) layer 30 may be composed of an organic polymer that may include polyacrylate resin, epoxy resin, phenol resin, polyamide resin, polyimide resin, unsaturated polyester resin, polyphenylenether resin, polyphenylenesulfide resin, or benzocyclobutene (BCB). The organic planarization layer 30 may be deposited into the via opening 35 using any deposition process. For example, the organic planarization layer 30 may be deposited using spin on deposition, deposition from solution, chemical vapor deposition (CVD), and combinations thereof.

Following deposition, the organic planarization layer 30 may be recessed within the via opening 35. Recessing the organic planarization layer 30 may remove any portion of the organic planarization layer that extends outside the via opening 35. This can include at least one of etching process and/or planarization processes. For example, if the organic planarization layer 30 is deposited to overfill the via opening 35, a chemical mechanical planarization (CMP) process may be first employed to remove the excess. Thereafter, the organic planarization layer 30 may be etched to recess the organic planarization layer (OPL) within the via opening 35 to a depth that exposes the portion of the blanket material layer for the inert electrode 10 that is to be removed. The etch process may be a wet chemical etch, or a dry etch, such as reactive ion etching (RIE). In some embodiments, the organic planarization layer 30 is recessed to a depth that exposes enough of the blanket material layer for the inert electrode 10 to be removed so that enough space is present on the upper sidewall of the via opening 35 to allow for at least the metal oxide layer 15 to encapsulate the upper portion of the inert electrode 10. This provides that the inert electrode 10 is physically separated from the later formed upper contact line 101. In some embodiments, the organic planarization layer 30 is recessed to a depth within the via opening to allow for a portion of both the metal oxide layer 15 and the reactive electrode 15 to encapsulate the inert electrode 10 and extend over at least a portion of the upper sidewall of the via opening 35.

Following recessing of the organic planarization layer, the exposed portions of the blanket material layer for the inert electrode 10 may be removed by a selective etch process. As used herein, the term "selective" in reference to a material removal process denotes that the rate of material removal for a first material, e.g., the blanket material layer for the inert electrode 10, is greater than the rate of removal for at least another material, e.g., the dielectric layer 5 and/or the organic planarization layer 30, of the structure to which the material removal process is being applied. For example, in one embodiment, a selective etch may include an etch chemistry that removes a first material selectively to a second material by a ratio of 10:1 or greater.

In one embodiment, when a wet etch is employed to remove the exposed portion of the conformal material layer that has been blanket deposited for providing the inert electrode 10, the wet etch chemistry may include hydrogen peroxide. A wet etch chemistry composed of hydrogen peroxide can remove the exposed portion of the conformal material layer for the inert electrode, which in some embodiments can be composed of titanium nitride (TiN), selectively to the organic planarization layer 30.

In another embodiment, when reactive ion etching (RIE) is employed to remove the exposed portion of the conformal material layer that has been blanket deposited for providing the inert electrode 10, the reactive ion etching (RIE) chemistry may include Ar, He, Xe, Cl2, HCl, HBr, CF4, SF6, etc., their mixtures and combinations thereof. For example, in one embodiment, RIE chemistry $Ar/Cl_2$ is used. A reactive ion etching (RIE) chemistry composed of $Ar/Cl_2$ can remove the exposed portion of the conformal material layer for the inert electrode, which in some embodiments can be composed of titanium nitride (TiN), selectively to the organic planarization layer 30.

Figure 7:
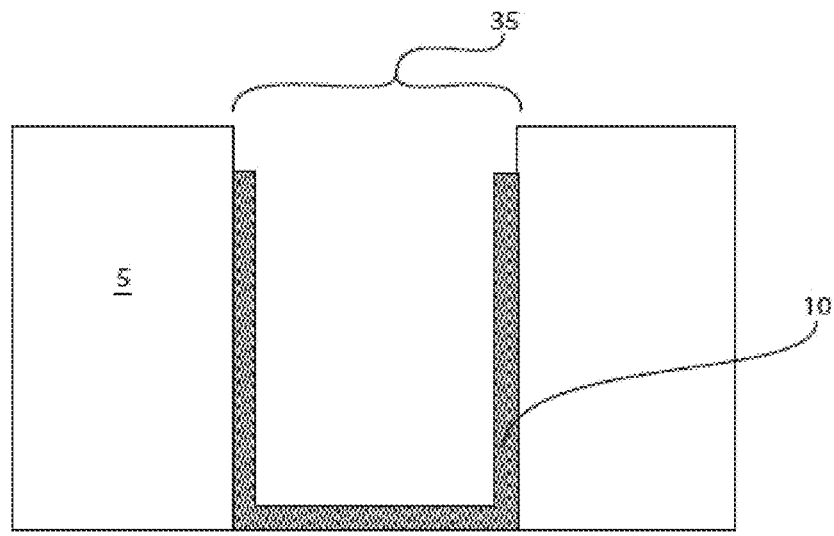
FIG. 7 is a side cross-sectional view depicting removing a remaining portion of the organic planarization layer from the structure depicted in FIG. 6 to expose the inert electrode.

FIG. 7 depicts one embodiment of removing a remaining portion of the organic planarization layer 30 from the structure depicted in FIG. 6 to expose the inert electrode 10. The structure depicted in FIG. 7 can provide the geometry for the inert electrode 10 for the resistive random access memory (ReRAM) cell 100 that is depicted in FIGS. 2 and 3. The removal of the organic planarization layer 30 can be achieved by wet-etching, using sulfuric acid, hydrogen peroxide and diluted combinations thereof; or by reactive ion etching (RIE) using gases such as $O_2$, $N_2$, $H_2$, $NH_3$, CO, $CO_2$, and combinations thereof.

Figure 8:
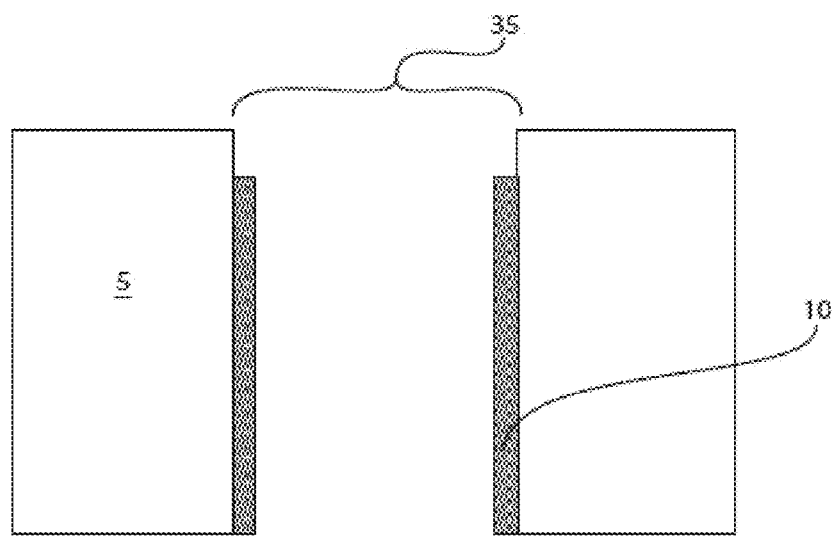
FIG. 8 is a side cross-sectional view depicting one embodiment of etching the material layer for the inert electrode depicted in FIG. 5 or FIG. 7 to provide the geometry for the inert electrode of the resistive random access memory (ReRAM) cell that is depicted in FIG. 4.

FIG. 8 depicts one embodiment of self-aligned etching the material layer for the inert electrode 10 depicted in FIG. 5 or FIG. 7 to provide the geometry for the inert electrode 10' of the resistive random access memory (ReRAM) cell that is depicted in FIG. 4. It is noted that this etch step is optional, and may be omitted. In the process flow that begins with the structure depicted in FIG. 5, an anisotropic etch step removes the horizontally orientated portions of the blanket deposited conformal layer for the inert electrode 10 without masking in the via region. Due to the anisotropic nature of the etch process, the upper surfaces of the vertically orientated portions of the blanket deposited conformal layer for the inert electrode 10 are recessed to a depth within the via during the process sequence from FIG. 5 to FIG. 8 As used herein, an "anisotropic etch process" denotes a material removal process in which the etch rate in the direction normal to the surface to be etched is greater than in the direction parallel to the surface to be etched. The anisotropic etch process may be provided by reactive ion etching (RIE). Reactive Ion Etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present disclosure include ion beam etching, plasma etching or laser ablation. In some embodiments, the anisotropic etch may also recess a minor portion of the vertically orientated section of the inert electrode 10'. The reactive ion etching (RIE) chemistry may include Ar, He, Xe, Cl2, HCl, HBr, CF4, SF6, etc., their mixtures and combinations thereof. For example, in one embodiment, RIE chemistry $Ar/Cl_2$ is used.

In the process flow that begins with the structure depicted in FIG. 7, which follows removing the organic planarization layer, an anisotropic etch step removes the horizontally orientated portions of the blanket deposited conformal layer for the inert electrode 10.

In the embodiment depicted in FIGS. 4 and 8, the horizontal portion of the inert electrode 30 is removed from a base of the via opening 35 to expose an underlying contact line 102.

Figure 9:
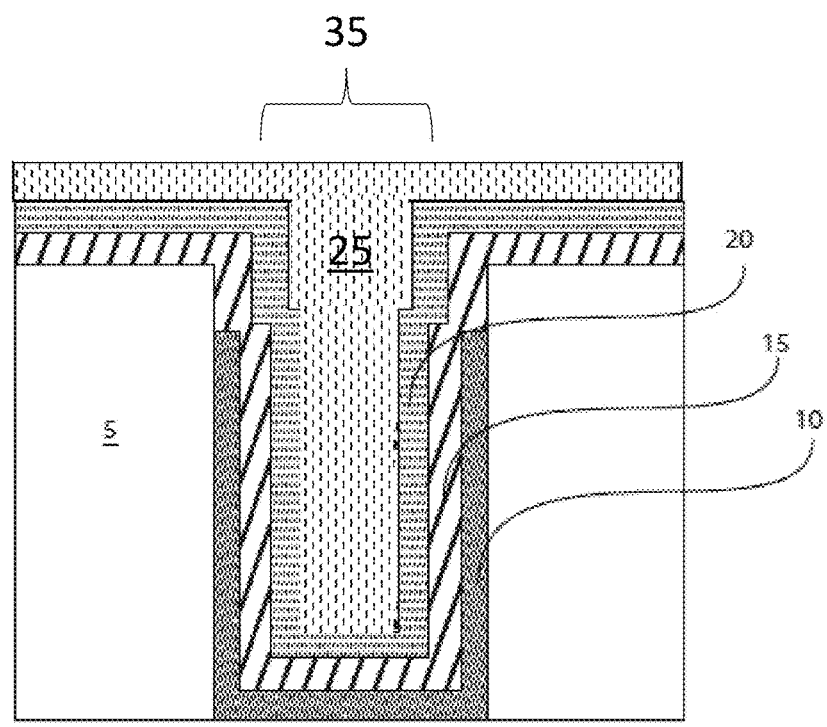
FIG. 9 is a side cross-sectional view depicting forming a material stack of a conformally deposited layer for the metal oxide layer that is formed directly on the inert electrode depicted in FIG. 7, and conformally depositing a material layer for the reactive electrode of a memory device, and depositing a metal gap fill, prior to planarization, as depicted in FIG. 1, in accordance with one embodiment of the present disclosure.

FIG. 9 depicts forming a material stack of a conformally deposited layer for the metal oxide layer 15 that is formed directly on the inert electrode 10 depicted in FIG. 7, conformally depositing a material layer for the reactive electrode 20 of a resistive random access memory (ReRAM) cell 100, as depicted in FIG. 2, and depositing a gap fill layer 25, as depicted in FIG. 2. The method steps depicted in FIG. 9 with minor modifications provided in the below description can also be applied to the method for providing the resistive random access memory (ReRAM) cell 100, as depicted in FIGS. 3 and 4. The metal-oxide layer 15, the inert electrode 20, and the gap fill layer 25, can then extend laterally atop the dielectric 5 outside of the via. These horizontal portions are further removed using reactive ion etching (RIE), a chemical-mechanical polishing (CMP), or a combination thereof, to isolate the cell, expose the dielectric 5, and expose the co-planar active electrode 20 and gap fill 25 as depicted in FIG. 2 for subsequent contacting of the top metal line 101 as depicted in FIG. 1. It is noted that in FIG. 9, the gap fill layer 25 is depicted following planarization and/or etching to recess the material layer for the gap fill layer 25, and to remove the lateral portions of the material layer for the gap fill layer 25.

In some embodiments, the metal oxide layer 15 is composed of a composition selected from the group consisting of hafnium oxide ($HfO_2$), tantalum oxide ($Ta_2O_5$), titanium oxide ($TiO_2$), tungsten oxide ($WO_3$), zirconium oxide ($ZrO_2$), aluminum oxide ($Al_2O_3$), strontium titanium oxide ($SrTiO_3$) and combinations thereof. The metal oxide layer 15 may have a thickness ranging from 1 nm to 15 nm. In one example, the metal oxide layer 15 may be composed of hafnium oxide ($HfO_2$), and may have a thickness ranging from 3 nm to 10 nm. In another example, the metal oxide layer 15 may be composed of tantalum oxide ($Ta_2O_5$), and may have a thickness ranging from 3 nm to 10 nm. For example the metal oxide conformal layer can be deposited by atomic layer deposition of $HfO_2$ using subsequent pulsed of $HfCl_4$ and $H_2O$ precursors at temperatures above 200 C.

In some embodiments, the metal oxide layer 15 is deposited into direct contact with the inert electrode 10, 10', wherein the metal oxide layer 15 is formed using atomic layer deposition (ALD), and also has a conformal thickness with vertically orientated portions on a portion of the inert electrode 10, 10' overlying the sidewalls of the via opening 35, and horizontally orientated portions positioned at a base of the via opening 35. To provide the resistive random access memory (ReRAM) cell 100, as depicted in FIGS. 2 and 3, the horizontal portion of the metal oxide layer 15 is formed directly on the horizontal portion of the inert electrode 10. To provide the resistive random access memory (ReRAM) cell 100, as depicted in FIG. 4, the horizontal portion of the metal oxide layer 15 is formed directly on the lower contact line 102. The conformal thickness of the metal oxide layer 15 is continuous from the vertically orientated portions to the horizontally orientated portions, in which when viewed from a side cross-section as illustrated in FIGS. 2-4, the metal oxide layer 15 has a U-shaped geometry. The metal oxide layer 15 may be blanket deposited 15 encapsulating the inert electrode 10, 10' within the via opening; extending in direct contact along the upper sidewall of the via opening 35; and extending over the upper surface of the dielectric layer 5.

Referring to FIG. 9, following the formation of the metal oxide layer 15, a blanket conformal material layer for the reactive electrode 20 may be deposited using atomic layer deposition (ALD). The material layer (or material layers) for the reactive electrode 20 that can be formed using atomic layer deposition may be formed in direct contact with the metal oxide layer 15. For example, one or more material layers for the reactive electrode 20 can be formed in direct contact with the vertically orientated and horizontally orientated portions of the metal oxide layer 15. In some embodiments, the reactive electrode 20 can becomposed of a metal containing composition selected from the group consisting of titanium nitride (TiN), tantalum nitride (TaN), (M)AlC, where M is a transition metal selected from the group consisting of Ti, Ta, and Nb, and combinations thereof. In some embodiments, the reactive electrode 20 may have a thickness ranging from 1 nm to 70 nm.

The reactive electrode 20 can be composed of a single metal composition and can be composed of a single atomic layer deposition (ALD) formed layer. In other embodiments, the reactive electrode 20 is composed of a material stack including a titanium (Ti) rich titanium nitride (TiN) layer, and a titanium aluminum carbon containing, e.g., (Ti)AlC, containing stack. In one example, the reactive electrode 20 is composed of a titanium nitride (TiN) first layer having a thickness ranging from 0.3 nm to 3 nm that is in direct contact with the metal oxide layer 15; a titanium aluminum carbon (TiAlC) layer having a thickness ranging from 1 nm to 5 nm that is in direct contact with the titanium nitride (TiN) first layer; and a titanium nitride (TiN) second layer having a thickness ranging from 10 nm to 50 nm that is in direct contact with the titanium aluminum carbon (TiAlC) layer.

In some embodiments, to provide the reactive electrode 20 depicted in FIGS. 2 and 4, the material layer (or layers) for the reactive electrode 20 may be conformally deposited blanket layers that can be formed by atomic layer deposition (ALD). The material layer for the reactive electrode 20 may have a conformal thickness that is deposited using atomic layer deposition (ALD), in which the material layer for the reactive electrode includes vertically orientated portions on a portion of the metal oxide layer 15 overlying the sidewalls of the via opening 35, and horizontally orientated portions on portions of the metal oxide layer 15 overlying the base of the via opening 35. The conformal thickness of the reactive electrode 20 is continuous from the vertically orientated portions to the horizontally orientated portions, in which when viewed from a side cross-section as illustrated in FIGS. 2 and 4, the reactive electrode 20 has a U-shaped geometry. The blanket deposition process also forms a portion of the material layer for the reactive electrode 20 that extends from the via opening 35 over the portion of the metal oxide layer 15 that is overlying the upper surface of the dielectric layer 5.

In accordance with some embodiments of the method for forming the resistive random access memory (ReRAM) cell 100, as depicted in FIGS. 2 and 4, following the formation of the material layer for the reactive electrode 20, a remainder of the via opening 35 not occupied by the inert electrode 10, 10', the metal oxide layer 15 and the reactive electrode 20 is filled with a metal fill 25. In some examples, the metal fill 25 may be composed of tungsten (W), aluminum (Al), copper (Cu), titanium nitride (TiN) or combinations thereof. The metal fill 25 may be deposited using physical vapor deposition (PVD), e.g., sputtering; plating, e.g., electroplating and/or electroless plating; chemical vapor deposition, atomic layer deposition (ALD); or a combination thereof. In some embodiments, the metal fill 25 fills an entirety of the remaining space of the via opening 35.

In some embodiments, following formation of the metal fill 25, the structure may be planarized to remove the portions of the metal fill 25, the metal oxide layer 15 and the reactive electrode 20 that extend outside the via opening 35, and may be present over the upper surface of the dielectric layer 5. The planarization process may include chemical mechanical planarization, a reactive ion etching process (RIE), or a combination thereof.

In other embodiments, to provide the random access memory (ReRAM) cell 100, as depicted in FIG. 3, the material layer for the reactive electrode 20', is deposited to fill a remainder of the via opening 35 not occupied by the inert electrode 10 and the metal oxide layer 35. The material for the reactive electrode 20' for these embodiments may be deposited using atomic layer deposition (ALD), physical vapor deposition (PVD), e.g., sputtering; plating, e.g., electroplating and/or electroless plating; chemical vapor deposition; or a combination thereof.

In some embodiments, following formation of the reactive electrode 20' that fill the remainder of the via opening 35 depcited in FIG. 3, the structure may be planarized to remove the portions of the metal oxide layer 15 and the reactive electrode 20 that extend outside the via opening 35, and may be present over the upper surface of the dielectric layer 5. The planarization process may include chemical mechanical planarization.

In a following process sequence, the upper contact line 101 may be formed in direct contact with the planarized surface of the random access memory (ReRAM) cell 100. Forming the upper contact line 101 may be provided by depositing a dielectric layer; forming a line trench in the dielectric layer exposing the planarized surface of the random access memory (ReRAM) cell 100; and depositing an electrically conductive material, e.g., metal, within the line trench to provide the upper contact line 101.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Having described preferred embodiments of an apparatus and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A memory device comprising:
a via opening through a dielectric layer;
an inert electrode including a conformal thickness present on sidewalls, recessed from a top surface of the via, and a base surface of the via opening through the dielectric layer;
a metal oxide layer present in direct contact with the inert electrode, the metal oxide layer having a conformal thickness, vertically orientated portions on a portion of the inert electrode overlying the sidewalls of the via opening, and horizontally orientated portions on portions of the inert electrode overlying the base of the via opening; and
a reactive electrode is in direct contact with the metal oxide layer present on the vertically orientated and horizontally orientated portions of the metal oxide layer, with an uppermost surface of the reactive electrode being coplanar with an uppermost surface of the metal oxide layer, wherein switching of the memory device includes a laterally orientated direction across the vertically orientated portion of the metal oxide layer in regions not modified by patterning of the metal oxide layer.

2. The memory device of claim 1, wherein the inert electrode, the metal oxide layer and the reactive electrode provide a resistive random access memory cell of the memory device that is a vertically orientated resistive random access memory device with a cross-bar architecture.

3. The memory device of claim 2, wherein the inert electrode is composed of a metal containing composition selected from the group consisting of ruthenium (Ru), titanium nitride (TiN), tungsten (W), tantalum nitride (TaN) and combinations thereof.

4. The memory device of claim 3, wherein the inert electrode is in direct contact with a bottom contact of the cross-bar architecture.

5. The memory device of claim 4, wherein the inert electrode has said conformal thickness ranging from 1 nm to 50 nm.

6. The memory device of claim 2, wherein the metal oxide layer is composed of a composition selected from the group consisting of hafnium oxide (HfO$_2$), tantalum oxide (Ta$_2$O$_5$), titanium oxide (TiO$_2$), tungsten oxide (WO$_3$), zirconium oxide (ZrO$_2$), aluminum oxide (Al$_2$O$_3$), strontium titanium oxide (SrTiO$_3$) and combinations thereof.

7. The memory device of claim 6, wherein the metal oxide layer has said conformal thickness ranging from 1 nm to 15 nm.

8. The memory device of claim 2, wherein the reactive electrode is composed of a metal containing composition selected from the group consisting of titanium nitride (TiN), tantalum nitride (TaN), carbide of aluminum (AlC), metal-containing carbide of aluminum (M)AlC, where M is a transition metal selected from the group consisting of Ti, Ta, and Nb, and combinations thereof.

9. The memory device of claim 8, wherein the reactive electrode is in direct contact with a top contact of the cross-bar architecture.

10. The memory device of claim 8, wherein the reactive electrode fills a remainder of the via opening not occupied by the metal oxide layer and the inert electrode.

11. The memory device of claim 1, wherein the reactive electrode has a conformal thickness having vertically orientated portions on a portion of the metal oxide overlying the sidewalls of the via opening, and horizontally orientated portions on portions of the metal oxide layer overlying the base of the via opening; wherein the memory device further comprises a metal fill that fills remainder of the via opening that is not occupied by the inert electrode, metal oxide layer and the reactive electrode.

12. A memory device comprising:
a via opening through a dielectric layer to a bottom contact line;
an inert electrode present on sidewalls of the via opening and recessed from a top surface of the via;
a metal oxide layer in direct contact with the inert electrode and the bottom contact line, wherein the metal oxide layer has a conformal thickness and has vertically orientated portions on the inert electrode, and horizontally orientated portions on a portion of the bottom contact line positioned at a base of the via opening; and
a reactive electrode is in direct contact with the metal oxide layer, wherein the reactive electrode has a conformal thickness and is present on the vertically orientated and horizontally orientated portions of the metal oxide layer, wherein switching of the memory device includes a laterally orientated direction across the vertically orientated portion of the metal oxide layer in regions not modified by patterning of the metal oxide layer.

13. A method forming a resistive switching memory stack that can provide for lateral switching of the resistive random access memory cell comprising:
forming an inert electrode having a conformal thickness present on at least a sidewall of a via opening through a dielectric layer by atomic layer deposition, wherein an upper surface of the inert electrode is recessed within the via opening;
forming a metal oxide layer in direct contact with the inert electrode, wherein the metal oxide layer is formed using atomic layer deposition and also has a conformal thickness with vertically orientated portions on a portion of the inert electrode overlying the sidewalls of the via opening, and horizontally orientated portions positioned at a base of the via opening; and
forming a reactive electrode with atomic layer deposition in direct contact with the metal oxide layer such that an uppermost surface of the reactive electrode is coplanar with an uppermost surface of the metal oxide layer, wherein the reactive electrode is present on the vertically orientated and horizontally orientated portions of the metal oxide layer, wherein switching of the memory device includes a laterally orientated direction across the vertically orientated portion of the metal oxide layer in regions not modified by patterning of the metal-oxide layer.

14. The method of claim 13, wherein forming the inert electrode comprises:
blanket depositing a conformal layer of a metal containing composition selected from the group consisting of ruthenium (Ru), titanium nitride (TiN), tungsten (W), tantalum nitride (TaN) and combinations thereof;
forming a recessed organic planarization layer in the via opening protecting a first portion of the conformal layer of metal containing composition for the inert electrode extending from the base of the via opening, wherein a second portion of the conformal layer of the metal containing composition for the inert electrode is exposed;
removing the second portion of the conformal layer of the metal containing composition with an etch process that is selective to the organic planarization layer; and
removing the organic planarization layer.

15. The method of claim 14, wherein following said removing of the organic planarization layer, a horizontal portion of the inert electrode is removed from a base of the via opening to expose an underlying contact line.

16. The method of claim 13, wherein forming the inert electrode comprises:
blanket depositing the conformal layer of a metal containing composition selected from the group consisting of ruthenium (Ru), titanium nitride (TiN), tungsten (W), tantalum nitride (TaN) and combinations thereof; and
anisotropically etching the conformal layer to remove horizontally orientated portions of the conformal layer and to recess an upper surface of the vertically orientated portion of the conformal layer within the recess.

17. The method of claim 13, wherein following said forming the metal oxide layer, the reactive electrode is deposited with a conformal thickness, and a remainder of the via opening not occupied by the inert electrode, metal oxide layer and the reactive electrode is filled with a metal fill.

18. The method of claim 13, wherein following said forming the metal oxide layer, the reactive electrode is deposited to fill a remainder of the via opening not occupied by the inert electrode and the metal oxide layer.

19. The method of claim 13, wherein the inert electrode is composed a metal containing composition selected from the group consisting of ruthenium (Ru), titanium nitride (TiN), tungsten (W), tantalum nitride (TaN) and combinations thereof.

20. The method of claim 13, wherein the metal oxide layer is composed of a composition selected from the group consisting of hafnium oxide (HfO$_2$), tantalum oxide (Ta$_2$O$_5$), titanium oxide (TiO$_2$), tungsten oxide (WO$_3$), zirconium oxide (ZrO$_2$), aluminum oxide (Al$_2$O$_3$), strontium titanium oxide (SrTiO$_3$) and combinations thereof.

* * * * *